LITHOGRAPHIC PRINTING PLATE

Filed July 1, 1966

REUBEN D. DEERHAKE
FREDERICK J. RAUNER
INVENTORS

BY [signature]
[signature]
ATTORNEYS

United States Patent Office 3,511,661 Patented May 12, 1970

3,511,661

LITHOGRAPHIC PRINTING PLATE

Frederick J. Rauner and Reubin D. Deerhake, Rochester, N.Y., assignors to Eastman Kodak Company, Rochester, N.Y., a corporation of New Jersey Filed July 1, 1966, Ser. No. 567,031
Int. Cl. G03c *1/94*
U.S. Cl. 96—86 16 Claims

ABSTRACT OF THE DISCLOSURE

A lithographic printing plate comprises an aluminum surface which is anodized with phosphoric acid and which has thereon ink receptive image patterns or image forming layers. The aluminum surface comprises a cellular pattern of aluminum oxide consisting of cells with porous openings about 200 to 750 A. in average diameter and the surface comprises about 10 to 200 mg./square meter aluminum phosphate.

This invention relates to improved anodized aluminum lithographic surfaces and their use in lithography. More particularly, this invention concerns presensitized lithographic plate-making materials comprising our improved supports.

Aluminum is widely used as the support for lithographic printing plates because of availability, low cost, light weight, flexibility, good dimensional stability, etc. Water receptivity, which results from the presence of a surface layer of aluminum oxide formed by aerial oxidation, may be further enhanced by anodizing the aluminum in an electrolytic solution such as sulfuric acid, oxalic acid, or chromic acid. However, it has been difficult to take full advantage of this beneficial property, particularly in photolithographic applications, because of the high chemical activity of the aluminum oxide surface and the resulting tendency to interact with sensitizing coatings to produce unwanted fog, mottle, desensitization, hardening, etc.

Insulating or barrier coatings between the aluminum surface and the overlying radiation sensitive coating may be used, but present further problems such as inadequate adhesion of the photosensitive layer and difficulty in removing the unexposed light sensitive coating completely in the background areas of the processed lithographic printing plate.

There is a need for an aluminum printing plate having an improved surface which will provide water receptivity at least as good as the best conventionally anodized aluminum lithographic supports, which will provide good adhesion for mechanically applied ink-receptive images and which will obviate the problems resulting from the barrier layers required when presensitizing layers are coated on conventional anodized aluminum lithographic supports.

We have discovered anodized aluminum lithographic plates and methods of preparing such plates, which provide plates having particularly good characteristics over previously known aluminum lithographic plates.

One object of our invention is to provide an improved anodized aluminum substrate for lithographic printing plates and lithographic plate materials with outstanding chemical inertness to overcoatings, with excellent water-receptivity and which affords outstanding adhesion to sensitized overcoatings and to lithographic printing images.

Another object is to provide improved anodized aluminum substrates which obviate the thick barrier interlayers normally required with radiation-sensitive overlayers to prevent interactions between the surface of the support and the photographic element.

A further object is to provide improved aluminum lithographic substrates for presensitized lithographic printing plate materials.

Another object is to provide an improved process for the preparation of chemically inert and highly hydrophilic aluminum supports for lithographic printing plates and printing plate materials.

A still further object is to provide a modified electrolytic process of preparing lithographic aluminum plates which, when used as the substrate for presensitized lithographic printing plate materials, improves the keeping properties and simplifies development.

It is still a further object to provide an improved anodized aluminum substrate suitable for application of ink-receptive image patterns and image-forming layers.

These and other objects have been achieved with an improved lithographic support comprising an aluminum substrate having a modified anodic surface.

Surface coatings, obtained on aluminum supports by anodizing, have been found to be essentially aluminum oxide which has a cellular structure in which the aluminum surface is completely covered with the aluminum oxide layer. The cells appear to be hexagonal in shape and closely packed so that the structure of the cells with regard to shape does not appear to be a significant feature. However, each of the cells appears to contain a pore which does not extend completely through the aluminum oxide layer and which is not completely circular in shape but instead appears to be more in the shape of a star. The average size of the pore depends upon the electrolytic media used in the anodizing operation and may be affected by other conditions observed during the anodizing operation, such as the concentration of the electrolyte, the voltage, duration of anodizing, etc. Therefore, since these conditions may be varied, the resulting surface is defined herein in terms of average pore size of the resulting surface. Since the electrolyte which is most useful in obtaining the desired product is phosphoric acid, the surface is also defined in terms of the aluminum phosphate, which is formed in the aluminum oxide layer. It has also been determined that the anodic layer tends to have an irregular or wavelike surface when taken in cross-section so that valleys and peaks can be observed.

The average diameter of the pores or openings in the cells, which characterizes the anodized surface of our invention, ranges from about 200 A. to about 750 A., which is much greater than the average pore size produced in the normal commercial aluminum anodizing operations. The aluminum phosphate which characterizes our improved aluminum lithographic surfaces, represents a concentration of from about 10 to about 200 mg. or more of aluminum phosphate per square meter. Excellent results are obtained in lithographic and photolithographic operations with aluminum supports according to our invention having surface pores of the order of 400 to 600 A. average diameter and about 50 mg. per square meter of aluminum phosphate combined on the anodized surface.

In carrying out our invention, we obtain an aluminum oxide layer by anodizing the aluminum surface in an aqueous solution containing phosphoric acid. The concentration of phosphoric acid can be varied widely. Good results are achieved with full strength syrupy phosphoric acid (85% $H_3PO_4$); dilutions down to 3% or 4% or less can also be used. Customarily, concentrations of 25% to 60% are selected to obviate frequent replenishment of the electrolyte. We may then firmly attach thereto a hydrophilic layer in an amount which substantially covers the anodic layer, except for certain discontinuities where it appears that the peaks of the oxide layer extend through the hydrophilic layer. However, there may be a very thin coating covering covering these peaks.

In one embodiment of our invention, an aluminum sheet or foil is cleaned to remove any dirt or oily film which may be present, such as by immersion in a caustic cleaning solution followed by rinsing and treating with a 10% aluminum bifluoride solution. The clean sheet is then anodized in a tank of phosphoric acid which has a concentration of about 15%, using the aluminum as the anode and using a relatively inert material such as lead or stainless steel as the cathode. This results in an anodic layer having an unique porous surface which can then be coated, if desired, with a thin coating of a hydrophilic material. It is particularly advantageous to use a water-soluble permanently hydrophilic material which can be coated from an aqueous solution. A solution containing polyacrylamide is especially useful for this purpose. Of course, for some purposes, an ink-receptive pattern or other layer may be applied directly on the anodic layer.

The hydrophilic coating is coated over the porous surface in a subbing amount permitting the peaks of the surface to extend above the coating.

After the hydrophilic coating has dried, a light sensitive coating can then be placed on the surface. Various light sensitive materials suitable for forming images for use in the lithographic printing process can be used. However, particularly useful materials are the light sensitive polycarbonate resins described in Borden et al., Canadian Pat. 696,997, issued Nov. 3, 1964. This material is dissolved in a suitable solvent such as monochlorobenzene and coated over the hydrophilic layer. After exposure, the unexposed areas are removed by processing with a suitable material such as benzyl alcohol and the plate is placed on a lithographic printing press wherein the image areas are subject to wetting with the greasy printing ink and the hydrophilic layers are water wettable.

In a particularly useful embodiment, the light sensitive layer is a light sensitive polymer having the following recurring groups in the polymer backbone:

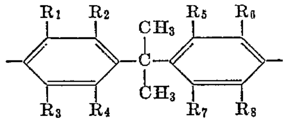

in which R to $R_8$ are each hydrogen or halogen. Another valuable light sensitive polymer has recurring groups in the polymer backbone which are:

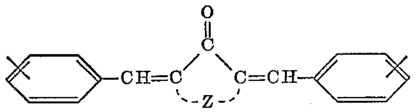

in which is $—CH_2—CH_2—$, $—CH_2CH_2CH_2—$, $—(CH_2—)_4$ or $—CH_2—CH(CH_3)—CH_2—$ Other suitable radiation sensitive layers which may be used include photosensitive polymers applied from aqueous or solvent solutions, silver halide emulsions, bichromated colloids, diazonium compounds, etc.

After processing, the plate is then ready to be placed on a lithographic press and used in printing or reproducing the desired writings or images. However, before placing it on the lithographic press, it is conventional to treat the printing surface of the plate with a desensitizing solution which desensitizes the background areas and prevents them from accepting ink. The desensitizing solution may take various forms. Gum arabic is a common one widely used. The image may be made visible by the use of a lacquer or a developing ink before printing on the press.

The subbing or other desired layer used on our improved aluminum lithographic supports may have a coverage of about 2 to 25 mg./ft.$^2$ substantially dried down, which contributes to the stability of the sensitive layer, the ease of processing, the water receptivity of the non-printing areas of the processed plate, etc., when ungrained aluminum is used. With grained aluminum, the coverage may be as high as 32 mg./ft.$^2$. The behavior of certain light sensitive resin layers as presensitizing coats for lithographic plates is improved by the presence of the hydrophilic water- or alkali-dispersible interlayer. The removal of the resin in the background regions is effected more simply and more completely when such an interlayer is present.

The accompanying drawing illustrates one embodiment of our invention:

Figure 1:
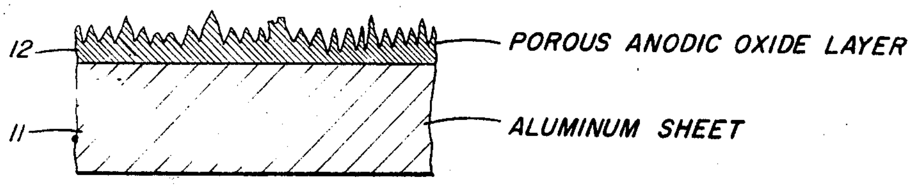
FIG. 1 shows an aluminum sheet 11 with a porous electrolytic anodic oxide layer 12 formed by treatment of an aluminum metal surface as an anode in a phosphoric acid solution.
Figure 2:
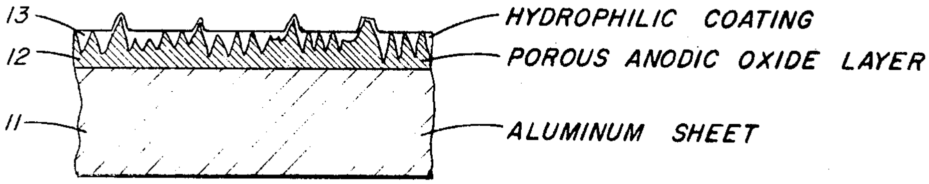
FIG. 2 shows the element of FIG. 1 after a thin coating of a water soluble, permanently hydrophilic material 13 is applied so that the general level of the coating is below the peaks of the oxide coating 12.
Figure 3:
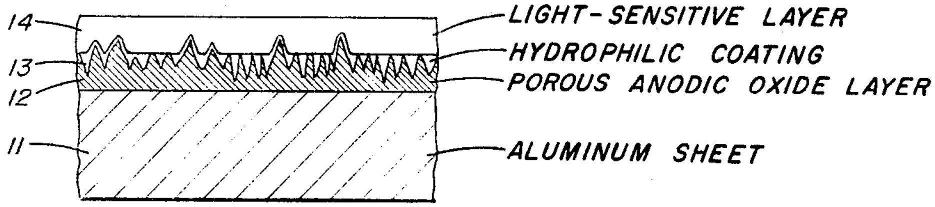
FIG. 3 shows the element of FIG. 2 with a light sensitive layer 14 coated over the hydrophilic coating 13.
Figure 4:
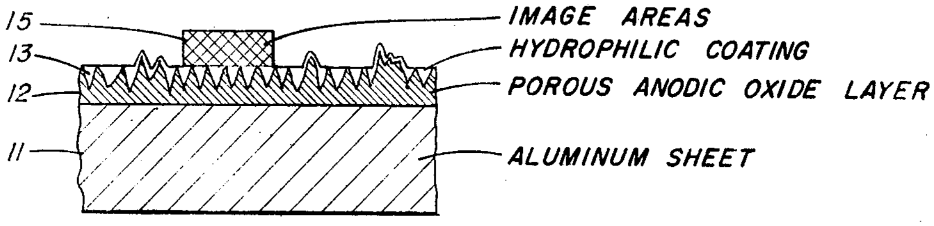
FIG. 4 shows the element of FIG. 3 after the light sensitive layer 14 has been exposed to an image and processed so that the non-image areas have been removed leaving an image area 15 subject to wetting with a greasy printing ink and the non-image areas subject to wetting with water.

The following examples are intended to illustrate our invention but not to limit it in any way.

EXAMPLE I

Three 10 x 15 x 0.015 inch sheets of ungrained aluminum were bathed for 30 seconds in a caustic cleaning solution at room temperature, spray rinsed with warm water, immersed into a 10% ammonium bifluoride solution at room temperature for 1 minute and again rinsed with warm water. The sheets were then anodized according to the following procedure: to serve as the anode, each plate was separately immersed into a tank containing 3 gallons of 42% phosphoric acid electrolyte at a temperature of 25° C. and wherein a 10 x 15 x 0.125 inch sheet of lead served as the cathode. Current was applied to the electrodes at a density of 24 amps per square foot for 6 minutes. Removed from the anodizing bath, each plate was then thoroughly rinsed with warm water and dried. Analysis of the surface anodized layer indicated the presence of about 50 mg./m.$^2$ of aluminum phosphate. The pore size of the oxide coating was found from electron micrographs to be on the average about 200 A. There was a range of sizes between 150–500 A. depending upon the shape of the pores. One surface of each of the plates was whirl-coated at 78 r.p.m.—first, with an 0.5% aqueous solution of PAM-200, a high-molecular weight polyacrylamide marketed by American Cyanamide Co., then, witha light sensitive coating of a composition as described in Example I of assignee's U.S. Pat. 2,852,379, published Sept. 16, 1958. The dry coverage of the polyacrylamide was 15 mg./ft.$^2$, that of the light sensitive resin, 85 mg./ft.$^2$.

One of the plates was retained as a control, the second and third were stored at a temperature of 90° C. for 2 and 4 hours, respectively. Thereafter, each plate was contact-exposed through a line negative for 45 seconds to a carbon lamp at a distance of 5 feet, swab-developed with a 60–40 mixture, by parts, of a Stoddard solvent and cyclohexanol, treated with a Gum Arabic desensitizer, and printed on a conventional offset lithographic press. Five thousand reproductions of excellent quality were obtained from each of the three plates.

EXAMPLE II

Printing plates were prepared, identical in all respects with those described in Example I, except that the hydrophilic sublayer was omitted. The pore sizes of the oxide coating were in the 150–500 A. range. While the control sample provided printed reproductions in number and quality equal to those obtained with the plates of Example I, the two samples temperature-treated at two and four hours respectively, delivered unacceptibly poor prints which showed severe background scumming and unsharp partial images.

EXAMPLE III

The tests described in Examples I and II were essentially repeated with the replacement of the light sensitive resin by a light sensitive polycarbonate comprising the product of a condensation reaction between 0.11 mole bisphenol "A," 0.142 mole divanillal cyclopentanone and 0.30 mole phosgene as described in Canadian Pat. 696,-997. The results obtained were similar to those obtained with the plates described in Examples I and II.

EXAMPLE IV

Several sheets of ungrained aluminum were anodized in a 24% phosphoric acid electrolyte and prepared for coating as described in the preceding examples. One of them was whirl-coated with an 0.5% aqueous dope of high-molecular weight polyacrylamide to give a dry coverage of about 30 mg./ft.$^2$ and, upon drying, overcoated with a 2% solution in chlorobenzene of a light sensitive polycarbonate comprising the product of a condensation reaction between 0.10 mole of divanillal cyclopentanone and 0.13 mole of neopentyl bischloro formate as described in Canadian Pat. 696,997 to give a dry coverage of about 96 mg./ft.$^2$. After exposure to a line negative, an attempt was made to develop the plate with benzyl alcohol. The entire polymer layer, i.e. image and non-image porous alike, were removed.

EXAMPLE V

Five 10 x 15 x 0.015 inch sheets of ungrained aluminum were prepared for anodization as described in Example I. To serve as the anode, each sheet was separately immersed into a tank containing 3 gallons of 15% sulfuric acid electrolyte at a temperature of 26° C. and wherein a 10 x 15 x 0.125 inch sheet of lead served as the cathode. Current was applied to the electrodes for 5 minutes at a density of 26 amps per square foot. Removed from the electrolyte, the plates were thoroughly rinsed with warm water and dried. Analysis of the pore size of the aluminum oxide layer from electron micrographs indicated a pore size which was nowhere bigger than 100 A. The range in sizes was between 50–100 A.

One surface of each sheet was then whirl-coated at 78 r.p.m. with a preparation of ethylene maleic anhydride to give dry coverages of 2, 5, 10, 20 and 30 mg./ft.$^3$, respectively. After the application thereover of a light sensitive coat according to Example I, each sheet was exposed and swab-developed as described in Example I. Inadequate removal of the image-forming top coat from the unexposed areas and partial dissolution of exposed image portions caused the plates to deliver prints of unacceptable quality. Several other aluminum sheets were anodized in a 14% sulfuric acid electrolyte under the above described conditions, each for a different length of time ranging from 1 to 17 minutes at about 2 minute intervals. Two other series of plates were anodized at varied current densities, ranging from about 5 to about 50 amps per square foot and at varied temperatures ranging from about 20° C. to about 45° C. The above tests were performed for the purpose of both varying the thickness of the aluminum oxide layer on the aluminum surface and of varying the size and probable dimension of the pores of the anodic film. None of the supports prepared under any of the above described conditions had a pore size as great as 200 A. or could be used to prepare satisfactory plates according to our invention. No aluminum phosphate was found to be present in the aluminum oxide layer.

EXAMPLE VI

Five sheets of aluminum alloy 3003 were mechanically grained, rinsed with distilled water, dried, immersed for 1 minute into a 10% solution of $NH_4 \cdot HF_2$, again rinsed with distilled water, separately anodized in a 68% phosphoric acid electrolyte for 6 minutes at a temperature of 25° C. and a current density of 15 amps, rinsed with distilled water and dried. The pore size of the anodized layer was in the 150–500 A. range. Each anodized sheet was found to contain at least 10 mg./m.$^2$ of aluminum phosphate.

The plates were whirl-coated with the hydrophilic sublayers and at the approximate concentrations as described below:

(a) polyacrylamide PAM–200, about 18 mg./ft.$^2$
(b) carboxymethylcellulose, about 25 mg./ft.$^2$
(c) copolymer of methylvinyl ether and maleic anhydride, about 7 mg./ft.$^2$
(d) ethylene maleic anhydride, about 15 mg./ft.$^2$
(e) poly[vinylbenzal-2,4-disulfonic acid], sodium salt, about 32 mg./ft.$^2$ Each of the five sublayers was then overcoated at a wet coverage of 7 ml./ft.$^2$ with a fine-grain photographic silver halide emulsion prepared by combining the following portions:

Silver chloride emulsion containing 200 grams of gelatin per silver mole which contains 1 mole of silver for 4.25 kilograms of emulsion—8.5 grams
4-phenylcatechol dispersion containing 50 grams of 4-phenylcatechol and 50 grams of gelatin per 700 grams total weight—28.0 grams
15 percent aqueous saponin solution—1.0 ml.

When dry, each of the silver halide emulsion layers contained per square foot:

| | Mg. |
|---|---|
| Silver | 130 |
| 4-phenylcatechol | 123 |
| Gelatin | 370 |

Each of the coated plates was slit into two equal sheets, one of which was retained as a control, while the other was incubated for 1 week at a temperature of 135° F. and a relative humidity of 35%.

All of the coatings were exposed to a high-contrast line negative and activated for 15 seconds in a 15% aqueous $K_2CO_3$ solution at a temperature of 72° F. The unexposed, and consequently unhardened areas of the emulsion, were then washed away with a spray of tap water at a temperature of 105° F. Having been dried, the coated side of each plate was swabbed with an image conditioner disclosed in British Pat. 934,691 to improve ink receptivity of the unremoved colloidal image portions. The copies obtained by printing the incubated samples, as well as the control plates on a lithographic press, were excellent reproductions of the originals.

EXAMPLE VII

Three sheets of ungrained aluminum, designated (a), (b) and (c), were cleaned as described in Example I and anodized in an 85% phosphoric acid electrolyte at a temperature of 20° C. and a current density of 15 amps/ft.$^2$ for the various periods of time as shown below:

(a) 4 min.
(b) 2 min.
(c) 1 min.

Microscopic measurements of cross-sectional samples of the above plates indicated an increase in the thickness of the aluminum oxide surface layer. The anodized surface layer of each of the sheets was found to contain aluminum phosphate.

The size of the pores was essentially the same for all three times of anodization; that is, the size range was between 150–500 A. The plates were identically whirl-coated at 78 r.p.m. with a solution of the following composition:

| | Ml. |
|---|---|
| Water | 152 |
| Hydrogen peroxide (27.5%) | 35 |
| Tetraisopropyl titanate | 3 |
| Phosphoric acid (85%) | 10 |

The plates, with uniform coverages of the hydrophilic sublayer formed by a deposit of about 15 mg./ft.$^2$ of the above solution, were sensitized with a 2% solution of the product as described in Canadian Pat. 696,997, of a condensation reaction between 0.02 mole divanillal cyclopentanone, 0.01 mole of salicalazine and 0.02 of bisphenol "A," exposed, swab-developed with benzyl alcohol and printed on a lithographic press. Plate (a) provided 1500 excellent copies, but plates (b) and (c) were inferior by developing background scum after about 20 impressions and by having certain image portions blinded after about 50 impressions.

Additional plates were made by coating anodized samples of (b) and (c) with the above hydrophilic material which was diluted 1:1 with water so that the coverage of solids on the porous anodic layer would be reduced by about one-half. Under these conditions, sample (b), when sensitized and processed, provided an acceptable printing plate. Further dilution of the hydrophilic layer to one-fourth its original concentration was necessary to produce satisfactory results with sample (c) which had the thinnest anodized layer.

EXAMPLE VIII

A positive working lithographic plate can be prepared using the support of our invention either by using a reversal type photographic emulsion or by using two light sensitive layers having different photographic speeds. If the top layer has greater sensitivity to light than the underlying layer, it may be separately exposed to a positive image, processed and that resultant image may be used as a negative and the exposure of the underlying layer whose sensitivity is such that it is unaffected by the exposure used to form the image in the top layer. A positive working plate based on this latter construction was prepared using the light sensitive plate prepared in Example 1. The aluminum support with the hydrophilic layer and light sensitive layer was coated with a camera speed silver halide emulsion of the type described in Example I of U.S. 2,596,756. The plate was exposed in a reversing camera to a line image for a short exposure. The exposed plate was activated in a caustic solution for 1½ minutes. The plate was rinsed with a water spray at 110° F. and air dried. At this stage, the plate contained a dense silver image in slight relief on top of the light sensitive ploymer layer. It was re-exposed for 1 minute, 20 inches from a 300-watt photo-flood lamp. The plate was further processed as in the previous example. The silver halide image and the unexposed image-forming polycarbonate layer were removed. Only the light-hardened areas which were ink receptive remained on top of the hydrophilic layer. Thus a positive working plate resulted. The plate was densensitized and several thousand good impressions were made.

EXAMPLE IX

A sheet of aluminum was anodized in a 50% phosphoric acid bath at 40° C. for 2 minutes using a current density of 20 amps per square foot. The size range of the pores was between 150–500 A. Aluminum phosphate was found to be present in the surface anodized layer at about 50 mg./m.$^2$. After rinsing and drying, the anodized surface was whirl-coated with an 0.3% polyacrylamide solution at 24° C. The hydrophilic layer was placed in an 0.1 N aqueous silver acetate bath for 30 seconds, rinsed and dried. The nucleated plate, prepared as above, was used as a receiver sheet for an exposed silver halide film which was processed in a solvent-containing developer. A positive working plate was produced by treating the silver image on the plate with ethyl mercaptan. The surface was rinsed lightly with water and the plate was run on a lithographic press producing many hundreds of copies.

EXAMPLE X

A sheet of aluminum foil was anodized as in Example I. This was treated with 0.5% solution of polyacrylamide to produce a coverage of 15 milligrams per square foot of dried coating. Using a silver gelatin transfer process, as described in U.S. 2,596,756, wherein unhardened gelatin is transferred from a slight sensitive sheet to a lithographic receiving sheet, the emulsion layer was exposed and developed. The image areas were transferred under pressure to the lithographic support described above. Initially, the image areas had poor ink receptivity. However, after treating the plate with an image conditioner, as described in Example VI, satisfactory prints were made. There was no background scum.

EXAMPLE XI

The surface of an aluminum plate, cleaned and anodized as described in Example I, was analyzed and found to contain approximately 50 mg./m.$^2$ of aluminum phosphate. The plate was coated with a hydrophilic sublayer at a coverage of 15 mg./ft.$^2$ of poly[vinylbenzal-2,4-disulfonic acid] and overcoated with the polycarbonate comprising the condensation product of 0.035 mole of 4,4′-dihydroxy chalcone, 0.03 mole bisphenol "A" and 0.035 mole of 2-(4-hydroxyphenylimino)-3-(4-hydroxyphenyl)-5-(4-azidobenzal)thiazolidine, at a coverage of 100 mg./ft.$^2$ as described in Canadian Pat. 696,997. When exposed, developed and printed as described in Example III, the plate yielded more than 5000 excellent copies. Three additional plates were prepared similarly and incubated at a temperature of 135° F. and a relative humidity of 75% for 1, 2 and 3 weeks respectively. Each plate yielded 5000 excellent copies.

EXAMPLE XII (A) One brushed aluminum plate was phosphoric acid-anodized as described in Example I. Five brushed aluminum plates were sulfuric acid-anodized as described in Example V. The latter five plates were then immersed for 3 minutes in solutions of 30% $H_3PO_4$, 15% $Na_2HPO_4$, 60% $H_3PO_4$, 3% $H_3PO_4$, and 15% $H_3PO_4$, respectively, and dried. All of the six plates were subcoated with hydroxyethylcellulose at a dry coverage of 25 mg./ft.$^2$ and overcoated wtih the azide resin of Example II. They were incubated for 5 days at a temperature of 120° F. and a relative humidity of 75%. The results obtained after exposure, processing and printing, demonstrated that the phosphoric acid-anodized plate was lithographically made superior over any of the other five plates.

(B) Tests similar to those described under (A) were repeated by replacing the sulfuric acid electrolyte with 30% chromic acid in one case and with 42% oxalic acid in another. The results obtained with these tests again revealed a considerable superiority of the phosphoric acid-anodized plate over those anodized in either of the other two acids.

EXAMPLE XIII

When several plates were provided with resinous ink-receptive images applied from an alcoholic solution of shellac through a sink screen stencil, the ink-water differential was considerably better with lithographic surfaces of our invention than with plates produced by sulfuric acid-anodization and subsequent after-treatment with phosphoric compounds. The above-described comparison is more specifically outlined below.

One aluminum plate was phophoric acid-anodized as described in Example I. Four aluminum plates were sulfuric acid-anodized as described in Example V. The latter four plates were then immersed for 2½ minutes in solutions of 15% $H_3PO_4$, 5% $H_3PO_4$, 3% $H_3PO_4$, 60% $H_3PO_4$, washed with water respectively, and dried. A silk screen stencil was placed on the surface of each of the above five plates and brushed with a solution of approximately 30 ml. of a commercially available shellac in 100 ml. of ethyl alcohol. After removal of the screens and drying of the surface of the non-image-carrying plates, the latter were used for printing on a conventional lithographic offset press. The copies obtained with the phosphoric acid-anodized sample had a spotlessly white non-image area, whereas each of the other four plates produced prints with an overall gray background and spotty deposits of printing ink.

The improved anodized aluminum surfaces of our invention can be used alone as lithographic supports with ink-receptive image areas supplied thereto by mechanical means such as by letterpress, gravure, or offset printing; by typewriting, electrostatic transfer, by screen stencil techniques, or the like. Such images can also be applied photographically, for example, by the use of light sensitive resins or silver halide emulsions.

Printing plates prepared with sulfuric acid-, chromic acid-, or oxalic acid-anodized aluminum supports have been found to be lithographically distinctly inferior to our plates.

Simple phosphate treatment of conventionally anodized aluminum surfaces is common in lithographic operations. Thus, many desensitizing baths and solutions for lithographic plates contain phosphoric acid. Such after-treatment does not produce the combination of a crystalline pattern of an aluminum phosphate and the large pore size which characterize our invention.

By contiguous, as used herein, we intended to mean in actual contact.

The invention has been described in detail with particular reference to preferred embodiments thereof, but it will be understood that variations and modifications can be effected within the spirit and scope of the invention as described hereinabove and as defined in the appended claims.

1. A lithographic element comprising a support with an anodized aluminum lithographic printing surface and a contiguous overlying layer, said anodized aluminum surface comprising a cellular pattern of aluminum oxide having cells with porous openings about 200 to 750 A. in average diameter and said surface comprising about 10 to 200 mg. per square meter aluminum phosphate, and said overlying layer comprising an image forming material selected from the group consisting of light sensitive materials and silver precipitating materials.

2. A lithographic printing plate of claim 1 in which said overlying layer comprises a light sensitive material

3. A lithographic printing plate of claim 2 in which the light sensitive material is a silver halide emulsion.

4. A lithographic printing plate of claim 2 in which the light sensitive material is a light sensitive resin.

5. A lithographic printing plate of claim 2 in which the light sensitive material is a light sensitive polycarbonate resin.

6. A plate of claim 2 in which the light sensitive material is a light sensitive polymer having the following recurring groups in the polymer backbone:

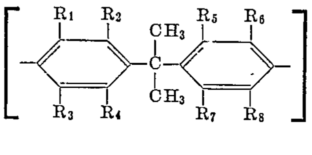

in which R to $R_8$ are each hydrogen or halogen.

7. A plate of claim 5 in which the recurring groups in the polymer backbone are:

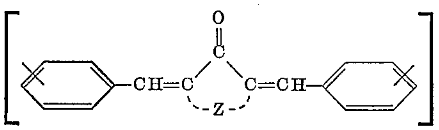

in which Z is $-CH_2-CH_2-$, $-CH_2CH_2CH_2-$, $-(CH_2-)_4$ or $$-CH_2-CH(CH_3)-CH_2-$$

8. A lithographic element comprising a support with an anodized aluminum lithographic printing surface, a contiguous hydrophilic layer over said surface and an overlying layer, said anodized aluminum surface comprising a cellular pattern of aluminum oxide having cells with porous openings about 200 to 750 A. in average diameter and said surface comprising about 10 to 200 mg. per square meter aluminum phosphate, and said overlying layer comprising an image forming material selected from the group consisting of light sensitive materials and silver precipitating materials.

9. A plate of claim 8 in which the hydrophilic layer has a coverage of 2 to 15 mg./ft.$^2$.

10. A lithographic printing plate of claim 1 in which said overlying layer comprises a light sensitive material.

11. A lithographic printing plate of claim 10 in which the light sensitive material is a silver halide emulsion.

12. A lithographic printing plate of claim 10 in which the light sensitive material is a light sensitive resin.

13. A lithographic printing plate of claim 10 in which the light sensitive material is a light sensitive polycarbonate resin.

14. A plate of claim 10 in which the light sensitive material is a light sensitive polymer having the following recurring groups in the polymer backbone:

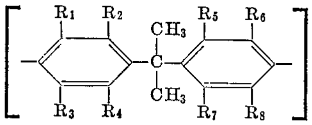

in which R to $R_8$ are each hydrogen or halogen.

15. A plate of claim 13 in which the recurring groups in the polymer backbone are:

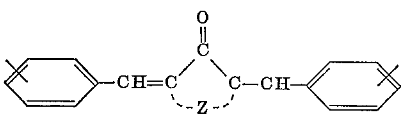

in which Z is $-CH_2-CH_2-$, $-CH_2CH_2CH_2-$, $-(CH_2-)_4$ or $$-CH_2-CH(CH_3)-CH_2-$$

16. A lithographic plate of claim 1 in which said overlying layer comprises a silver precipitating material.

(References on following page)

References Cited

UNITED STATES PATENTS

| | | | |
|---|---|---|---|
| 2,115,339 | 4/1938 | Mason | 96—86 |
| 2,681,310 | 6/1954 | Wood | 96—33 X |
| 2,760,431 | 8/1956 | Beatty | 96—33 X |
| 2,930,317 | 3/1960 | Perkins | 101—466 X |
| 3,280,734 | 10/1966 | Fromson | 96—33 X |

FOREIGN PATENTS

| | | |
|---|---|---|
| 464,757 | 4/1937 | Great Britain. |
| 716,402 | 10/1954 | Great Britain. |
| 781,714 | 8/1957 | Great Britain. |
| 565,696 | 7/1960 | Belgium. |

GEORGE F. LESMES, Primary Examiner

R. E. MARTIN, Assistant Examiner

U.S. Cl. X.R.

204—17, 58

PO-1050
(5/69)

UNITED STATES PATENT OFFICE
CERTIFICATE OF CORRECTION

Patent No. 3,511,661 Dated May 12, 1970

Inventor(s) Frederick J. Rauner and Reuben D. Deerhake

It is certified that error appears in the above-identified patent and that said Letters Patent are hereby corrected as shown below:

In the specification:

Column 3, line 53, after "which" insert ---Z---.

Column 4, line 57, "witha" should be ---with a---.

Column 6, line 30, delete "8.5 g." and insert ---85.0 g.---.

Column 7, line 54, delete "ploymer" and insert ---polymer---.

In the claims:

Column 10, line 32, of claim 10, delete "1" and insert ---8---.

SIGNED AND SEALED

SEP 29 1970

(SEAL)
Attest:

Edward M. Fletcher, Jr.
Attesting Officer

WILLIAM E. SCHUYLER, JR.
Commissioner of Patents

Disclaimer 3,511,661.—*Frederick J. Rauner*, and *Reubin D. Deerhake*, Rochester, N.Y. LITHOGRAPHIC PRINTING PLATE. Patent dated May 12, 1970. Disclaimer filed Apr. 1, 1974, by the assignee, *Eastman Kodak Company*.

Hereby enters this disclaimer to all claims of said patent.

[*Official Gazette October 15, 1974.*]